United States Patent [19]

Fried

[11] 3,902,132

[45] Aug. 26, 1975

[54] CLOSED LOOP VARIABLE FREQUENCY SIGNAL GENERATOR

[75] Inventor: Raymond L. Fried, Lynnwood, Wash.

[73] Assignee: John Fluke Mfg. Co., Inc., Mountlake Terrace, Wash.

[22] Filed: Apr. 15, 1974

[21] Appl. No.: 460,739

Related U.S. Application Data

[63] Continuation-in-part of Ser. No. 329,621, Feb. 5, 1973, abandoned.

[52] U.S. Cl. .................... 331/15; 331/19; 331/22; 331/25; 331/183

[51] Int. Cl.$^{2}$ .................... H03B 3/02; H03B 3/04

[58] Field of Search ............ 331/15, 18, 19, 22, 25, 331/183

[56] References Cited

UNITED STATES PATENTS

| | | | |
|---|---|---|---|
| 3,023,370 | 2/1962 | Waller | 331/25 X |
| 3,208,005 | 9/1965 | Guttman et al. | 331/19 X |
| 3,365,676 | 1/1968 | Buss | 331/18 X |
| 3,401,353 | 9/1968 | Hughes | 331/18 X |
| 3,427,561 | 2/1969 | Hamer | 331/19 |

*Primary Examiner*—Siegfried H. Grimm
*Attorney, Agent, or Firm*—Christensen, O'Connor, Garrison & Havelka

[57] ABSTRACT

A frequency conversion circuit for use in frequency synthesizers, frequency counters, and similar apparatus. Frequency mixing means having first and second inputs is provided, an input frequency being applied to the first mixing means input and a stepping frequency being applied to the second mixing means input. The mixing means is responsive to the input frequency and the stepping frequency to provide an output signal having a frequency equal to the frequency difference between the input frequency and the stepping frequency, both when the input frequency is higher than the stepping frequency, and when the input frequency is lower than the stepping frequency. For a single stepping frequency, an identical mixing means output signal is thus provided for two input frequencies. Means are also provided for determining whether the input frequency is higher or lower than the stepping frequency. Such a circuit may be used in frequency synthesizers using phase-locked loops, for instance, to lock the loop to two different output frequencies with a single stepping frequency.

14 Claims, 9 Drawing Figures

| | PORTION 1 | PORTION 2 | PORTION 3 | PORTION 4 |
|---|---|---|---|---|
| f OUT | 2.100 → 2.16 | 2.16 → 2.240 | 2.240 → 2.32 | 2.32 → 2.40 |
| f STEP = | 2.24 | 2.08 | 2.40 | 2.24 |
| f INPUT = | .140 → .080 | .080 → .160 | .160 → .080 | .080 → .160 |

| | PORTION 5 | PORTION 6 | PORTION 7 | PORTION 8 | PORTION 9 |
|---|---|---|---|---|---|
| f OUT | 2.40 → 2.98 | 2.98 → 2.56 | 2.56 → 2.64 | 2.64 → 2.72 | 2.72 → 2.80 |
| f STEP = | 2.56 | 2.40 | 2.72 | 2.56 | 2.88 |
| f INPUT = | .160 → .08 | .08 → .160 | .160 → .08 | .08 → .160 | .160 → .08 |

CLOSED LOOP VARIABLE FREQUENCY SIGNAL GENERATOR

BACKGROUND OF THE INVENTION

This is a continuation-in-part of application Ser. No. 329,621, filed Feb. 5, 1973, entitled "Frequency Synthesization Conversion Apparatus", and now abandoned.

The present invention relates generally to the frequency mixing art, and more specifically to the art of frequency synthesizers using frequency mixing means.

The concept of a frequency synthesizer which uses phase-locked loops to generate selected output frequencies is well-known in the art. Furthermore, the use of a series of stepping frequencies with such phase-locked loop synthesizers to provide continuous constant increment frequency coverage over a given output frequency range is also well-known. Typically, such frequency synthesizers use a series of stepping frequencies ($f_{step}$) equal to N times a reference frequency $f_{ref}$, where N is an integer which varies in a regular fashion (e.g., 1, 2, 3 . . . ). To avoid frequency discontinuities over a given output range, $f_{ref}$ must be equal to or less than the difference frequency between the highest and lowest input frequencies applied to the phaselocked loop. This relationship can be expressed as follows:

$$f_{ref} \leq (f_h - f_a)$$

where $f_h$ and $f_a$ are the high and low input frequencies, respectively.

The generation of the stepping frequencies becomes significantly more difficult and expensive, however, as frequencies into the microwave frequency region are desired at the output of the synthesizer. Furthermore, at such high frequencies, the $f_{ref}$ signal sidebands present in the generated $f_{step}$ signals hinder significant reduction of spurious signal output from the synthesizer.

Another technique for generation of stepping frequencies uses a harmonic frequency generator, such as a step recovery diode, in combination with selective filter. At the microwave frequencies, such a system becomes economically practical when compared with RF circuitry. However, the minimum necessary frequency separation between adjacent stepping frequencies to provide continuous constant increment frequency coverage over the output frequency range is frequently not great enough to enable state-of-the-art selective filters to select just one frequency from the harmonics available. Significant signal energy from adjacent frequencies is present, resulting in the injection of spurious signals into the phase-locked loop.

In accordance, with the above, it is a general object of the present invention to overcome the disadvantages of the prior art.

It is another object of the present invention to reduce the number of stepping frequencies in a frequency synthesizer using phase-locked loops necessary to achieve continuous constant increment frequency coverage over the output frequency range.

It is another object of the present invention to provide a practical frequency conversion circuit for use in frequency synthesizers which provide output frequencies in the microwave frequency range.

It is a further object of the present invention to provide a frequency conversion circuit for use in a frequency synthesizer wherein a single stepping frequency is used in combination with a predetermined range of input frequencies to cover two independent portions of the output frequency range.

It is another object of the present invention to provide a frequency conversion circuit for use with other circuiting wherein a single stepping frequency may be used to cover two portions of the frequency range used in the other circuitry.

Other and further objects, features and advantages of the present invention will become apparent as the description of the preferred embodiment proceeds.

SUMMARY OF THE INVENTION

Accordingly, the present invention includes a frequency mixing means having two inputs. A source of stepping frequencies is connected to one input, and a source of input frequencies is applied to the other input. The frequency mixing means is responsive to a input frequency and a stepping frequency to produce a frequency mixer output signal having a frequency equal to the difference between the input frequency and the stepping frequency applied at its inputs. A difference frequency is generated by the frequency mixing means both when the input frequency is higher than the stepping frequency and when the input frequency is lower than the stepping frequency. Means are provided for comparing the stepping frequency with the input frequency, the comparing means producing a first output if the input frequency is higher than the stepping frequency and a second output if the input frequency is lower than the stepping frequency. Means are also provided responsive to a single difference frequency from said frequency mixing means and said comparing means to produce a first output frequency when the comparing means produces said first output signal and a second output frequency when the comparing means produces said second output signal. A single stepping frequency may thus be used to produce output frequencies both when the input frequency is higher than the stepping frequency and when the input frequency is lower than the stepping frequency.

More specifically, the present invention in one aspect thereof in an embodiment of a frequency synthesizer, includes a phase-locked loop comprising a series connection a voltage controlled oscillator, a frequency mixing means, and a phase actuator. The frequency mixing means is responsive to output frequencies generated by the voltage-controlled oscillator and at least one stepping frequency to produce a frequency mixing means output signal having a frequency equal to the frequency difference between the output frequency and the stepping frequency applied to the voltage controlled oscillator. The phase detector is responsive to the frequency mixing means output signal and an input frequency to produce a phase detector output signal which in turn controls the output frequency of the voltage-controlled oscillator. The phase detector is responsive to the frequency mixing means output signal both when the output frequency of the VCO is higher than the stepping frequency and when the output frequency of the VCO is lower than the stepping frequency. A single stepping frequency can thus be used to generate first and second output frequencies for a given input frequency. Selection means are provided to permit an operator to select one of said first and second frequencies. A control means, responsive to the selection means, operates in conjunction with the phase detector to control the VCO such that the selected one of said first and second output frequencies is generated.

Furthermore, in the synthesizer embodiment, a plurality of stepping frequencies and input frequencies may be produced, wherein each combination of input frequency and stepping frequency has associated therewith the two output frequencies. Means are provided for selecting the proper input frequency and stepping frequency for the selected output frequency. The control means operates as above to assist in controlling the VCO to generate the selected output frequency from the two output frequencies possible.

DESCRIPTION OF THE DRAWINGS

A more thorough understanding of the invention may be obtained by a study of the following detailed description taken in conjunction with the accompanying drawings in which.

DESCRIPTION OF THE PREFERRED EMBODIMENT

Although the present invention in its preferred embodiment is described in the context of a frequency synthesizer, it should be recognized that the invention may be used with other apparatus, such as frequency counters, or any other circuitry using the difference frequency output of a frequency mixer to generate a given range of output frequencies. The description of the frequency synthesizer embodiment will serve to clarify the function and advantages of the frequency conversion circuit over the prior art, in a frequency synthesizer as well as with other circuits.

Figure 1:
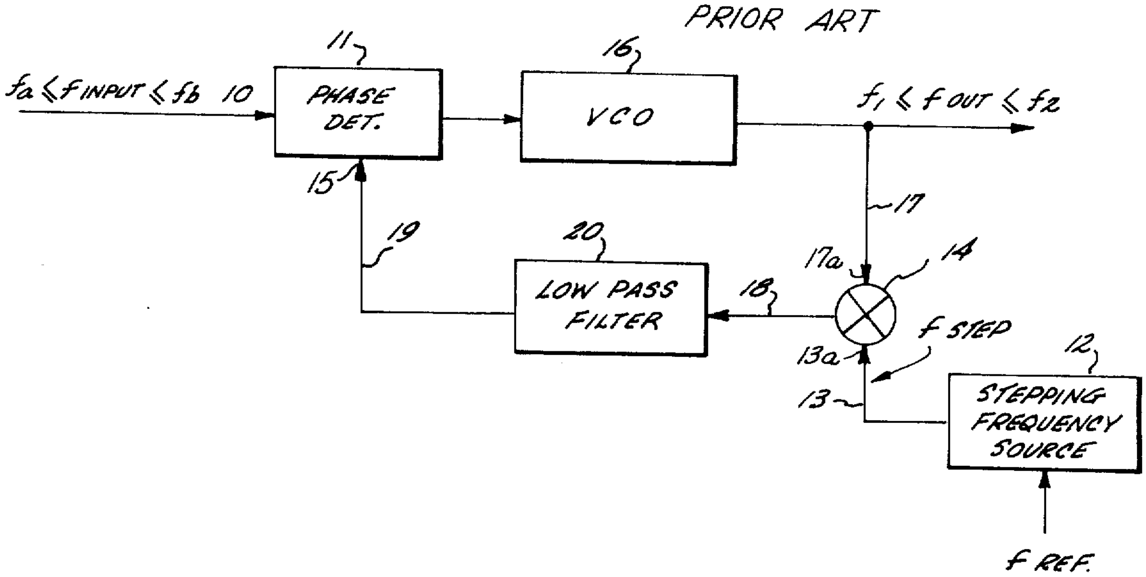
FIG. 1. PRIOR ART
FIG. 1 is a simplified block diagram of a prior art frequency conversion circuit, illustrating the operation of a phase-locked loop responsive to a series of stepping frequencies.

Referring to FIG. 1, a simplified block diagram of a prior art single phase-locked loop frequency synthesizer is shown. In operation, a predetermined range of input frequencies, $f_{input}$, is supplied at one input 10 of phase detector 11. The range of input frequencies has low and high boundaries, respectively, of $f_a$ and $f_b$, and is typically provided by a previous phase-locked loop synthesizer circuit, or from another frequency synthesizer. For continuous constant increment frequency coverage of the output frequency range, the reference frequency ($f_{ref}$) must be equal to or less than $(f_b - f_a)$ where $f_b$ is greater than $f_a$, expressed as follows:

$$f_{ref} \leq (f_b - f_a).$$

The reference frequency $f_{ref}$ drives a stepping frequency source 12, which generates a series of stepping frequencies. One selected stepping frequency $f_{step}$ is applied via line 13 to one input 13*a* of a frequency mixer 14. $F_{step}$ is typically an integral multiple of the reference frequency and varies according to the formula N $x f_{ref}$, where N is a variable whole integer introduced by the stepping frequency source 12.

Applied on line 17 to the other input 17*a* of the frequency mixer 14 is a portion of the circuit output signal $f_{out}$ from the voltage-controlled oscillator 16. The mixer 14 produces sum and difference frequencies between the signals applied at its respective inputs 13*a* and 17*a*, which sum and difference frequencies are applied on line 18 to a low-pass filter 20, which passes the difference frequency. The difference frequency is applied over line 19 to input 15 of phase detector 11. Phase detector 11 compares the phase of the signals present at inputs 10 and 15, and generates a DC output signal, which is proportional in magnitude to the phase difference between the input signals. The DC output signal from the phase detector 11 is applied to the VCO 16 and controls its output frequency accordingly. The loop will stabilize when the difference frequency between $f_{out}$ and $f_{step}$ is equal to the frequency of the input signal $f_{input}$ at input 10 of the phase detector 11.

The relationship between the frequency output of the mixer 14, the output signal $f_{out}$, $f_{step}$ and $f_{input}$ when the loop is stabilized can be expressed as follows:

$$f_{mixer\ output} = f_{out} - f_{step} = f_{input}.$$

Furthermore, since $f_{step}$ is equal to N $x f_{ref}$, the output frequency $f_{out}$ of the VCO 16 when the loop is stabilized may be expressed in terms of the reference frequency as follows:

$$f_{out} = f_{input} + N\ x\ f_{ref}.$$

Figure 2:
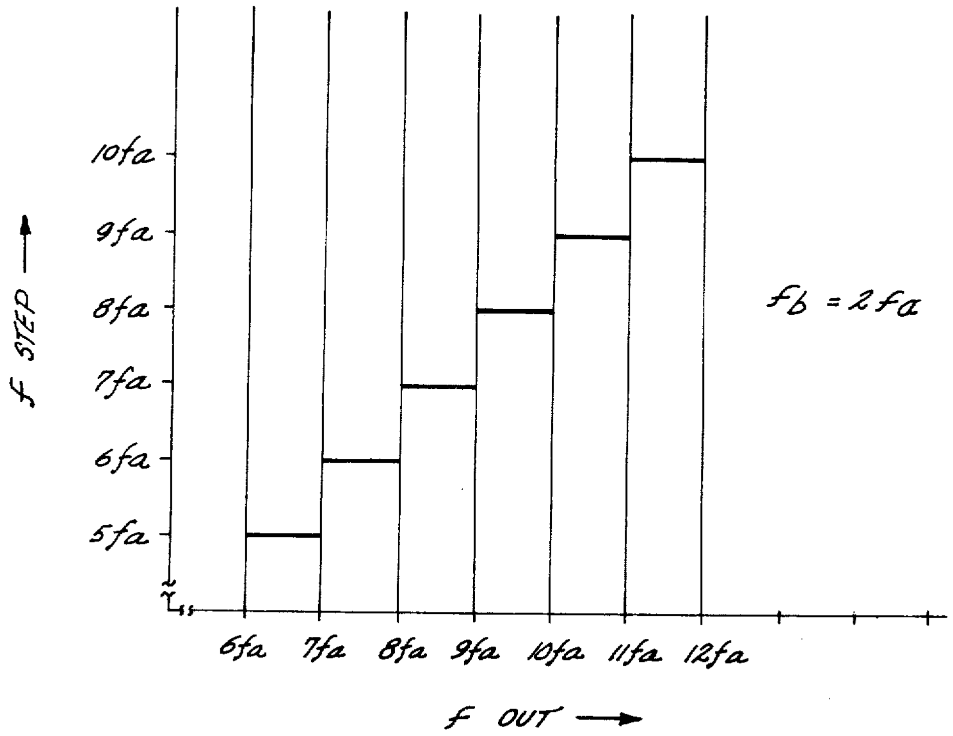
FIG. 2. PRIOR ART
FIG. 2 is a frequency distribution chart for the prior art showing the continuous constant increment output frequency coverage for successive stepping frequencies relative to a specified range of input frequencies.

Referring to FIG. 2, the output frequency coverage for the circuit of FIG. 1 is illustrated. For purposes of explanation, it is assumed that the input frequency boundaries are $f_b = 2f_a$, and that $f_{ref}$ is equal to $(f_b - f_a)$. With these assumptions, an output frequency range of $6f_a$ through $12f_a$ may be covered with successive $f_{steps}$ of $5f_a$ through $10f_a$. When the input frequency varies over a one octave frequency range, as shown in FIG. 2, $(f_b = 2f_a)$ the frequency separation between adjacent stepping frequencies must likewise not exceed this same one octave frequency bandwidth of the input frequencies, if continuous constant increment coverage of the output frequency range is to be achieved. In prior art synthesizers using phase-locked loops, a single stepping frequency, e.g., $5f_a$, is used to cover one portion of the output range e.g., $6f_a$ through $7f_a$.

Referring now again to FIG. 1, it has previously been explained that the loop will stabilize at a specific output frequency $f_{out}$ when the difference frequency from low-pass filter 20 is equal to the input frequency applied at input 10 of phase detector 11. The difference frequency value from low-pass filter 20, however, is the absolute frequency difference between $f_{step}$ and $f_{out}$. A single stepping frequency may thus be used to generate either of two output frequencies for a given input frequency, and more broadly, to provide frequency coverage of two independent portions of the desired output frequency range. The loop will stabilize when the frequency of the output signal $f_{out}$ on line 17 is either greater than or less than the stepping frequency by the frequency of the input signal $f_{input}$. Prior art synthesizers using phase-locked loops, however, do not utilize this capability of the frequency mixer. Rather, prior art circuits use only that difference frequency from mixer 14 wherein the output frequency $f_{out}$ is greater than the stepping frequency $f_{step}$. Typically, such circuits use a phase detector responsive only to a difference frequency when $f_{out}$ is greater than $f_{step}$. Such circuits provide the output frequency coverage shown in FIG. 2.

Figure 3:
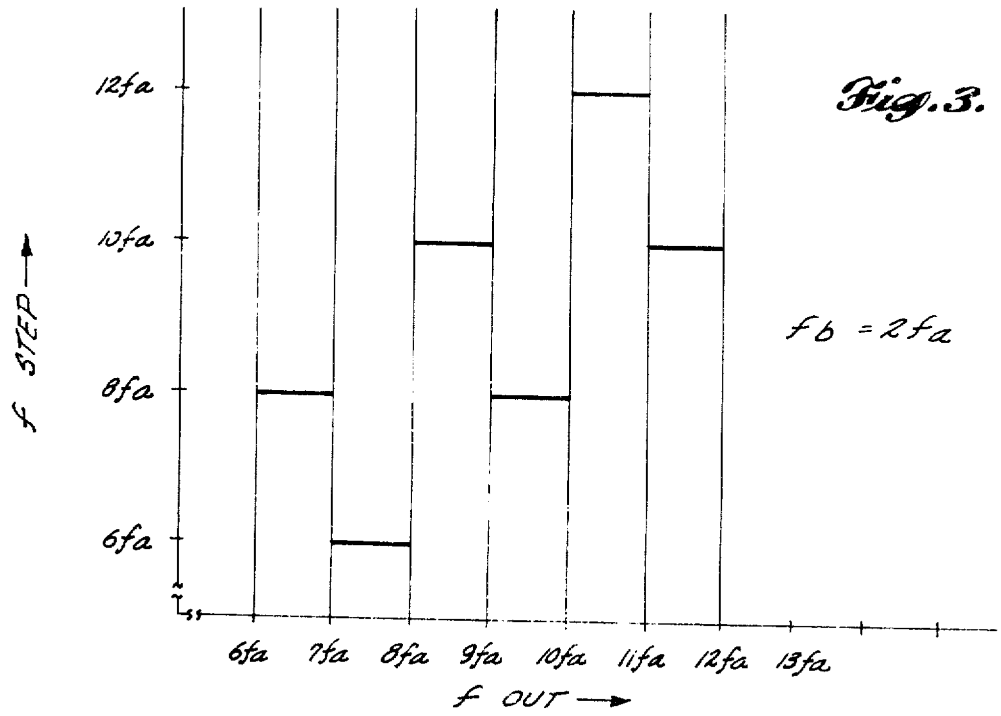
FIG. 3 is a frequency distribution chart for the circuit of the present invention showing the continuous constant increment output frequency coverage for selected stepping frequencies relative to a specified range of input frequencies.

FIG. 3, illustrates the output frequency coverage when a single stepping frequency $f_{step}$ is used to cover two independent output frequency range portions. By independent is meant that the two portions are separated by a number of intervening output frequencies using other stepping frequencies. Again, $f_b = 2f_a$ and $f_{ref} \leqslant (f_b - f_a)$. Each frequency in one portion of the output is higher in frequency than the stepping frequency by the value of the input frequencies, and each frequency in the other portion is lower in frequency than the stepping frequency by the value of the input frequencies. Thus, for example, for a stepping frequency of $8f_a$, and an input frequency range of $f_a$ through $2f_a$, the respective independent portions of the output frequency range covered are $6f_a$ through $7f_a$, and $9f_a$ through $10f_a$. Referring to FIG. 2, two stepping frequencies, $5f_a$ and $8f_a$, would be necessary to cover those same output frequency portions in the prior art. Thus, comparing FIGS. 2 and 3, the same continuous constant segment output frequency coverage may be achieved with significantly fewer stepping frequencies than previously required. This results in considerable savings with respect to the circuitry necessary to achieve the required series of stepping frequencies and provides other advantageous results more fully discussed in following paragraphs.

Figure 6:
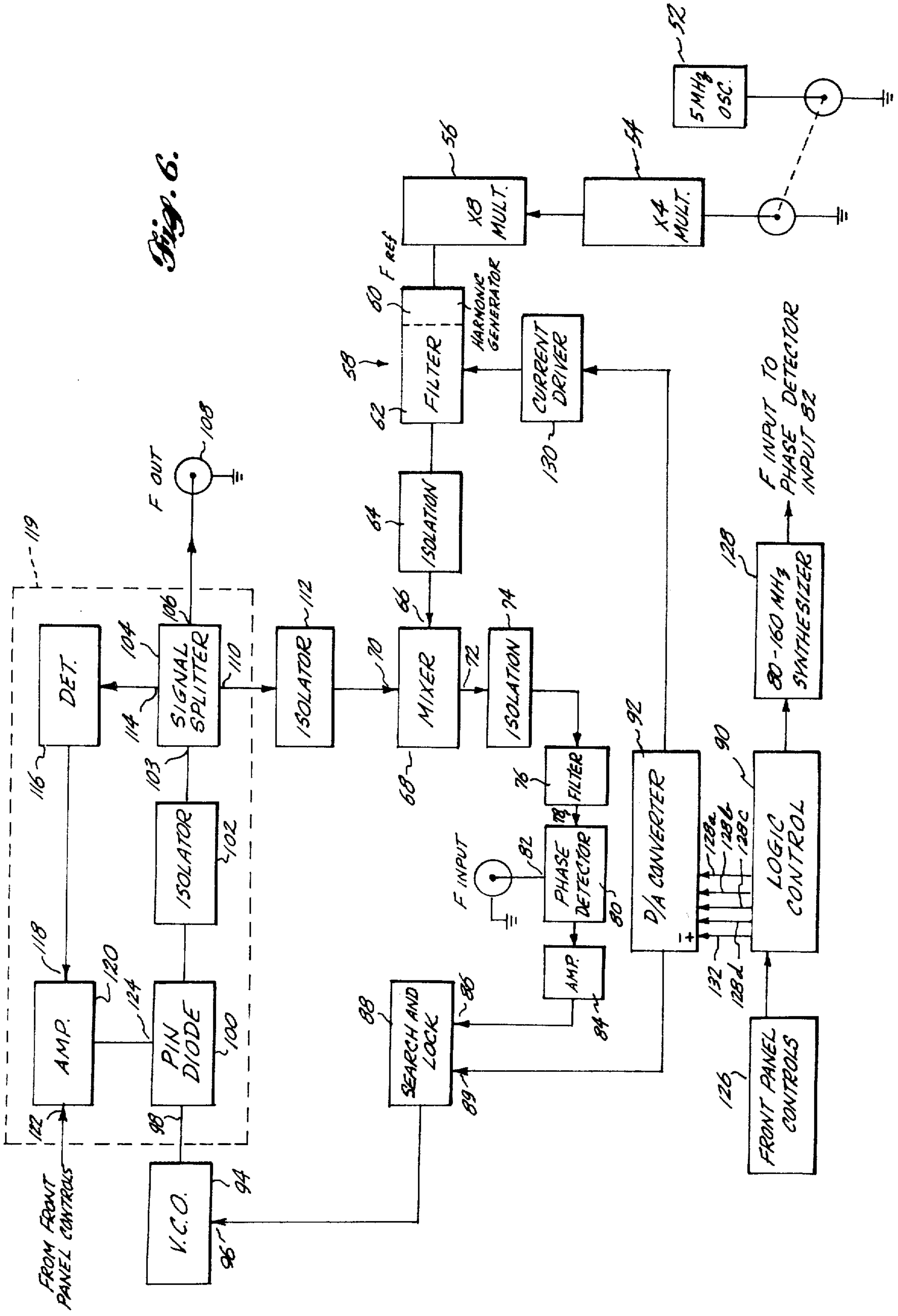
FIG. 6 is a block diagram of a preferred embodiment of the frequency conversion circuit.

FIG. 6 shows an embodiment of a frequency conversion circuit using a single stepping frequency for coverage of two independent output frequency range portions, with a reference frequency of 160 MHz, an input frequency range of 80–160 MHz and an output range of 2.1–2.8 GHz. A 5MHz standard frequency is generated by crystal oscillator 52, the output of which is multiplied by times-four multiplies 54 and times-eight multiplier 56 to produce the reference frequency $f_{ref}$ of 160 MHz. The 160 MHz reference frequency is applied to a stepping frequency selection circuit 58. Selection circuit 58 includes a nonlinear diode 60 or similar device which is responsive to the 160 MHz reference signal to generate a signal containing a large number of harmonics of 160 MHz. The output of the diode 60 is applied to a frequency discriminating circuit 62 such as a YIG filter, which is currentcontrolled to select one frequency from the harmonics generated by diode 60.

The selected frequency output from the stepping frequency selection circuit 58 is applied through a 10 db isolation circuit 64 to one input 66 of frequency mixer 68. The 10 db isolation circuit 64 provides electrical isolation between the mixer 68 and the stepping frequency selection circuit 58. A portion of the output signal $f_{out}$ is applied at input 70 of mixer 68. The sum and difference frequencies between the signals at inputs 66 and 70 of mixer 68 are provided at output 72, and in turn applied through a 3 db isolation circuit 74 to a low-pass filter 76. The output of low-pass filter 76, which is the difference frequency from mixer 68, is applied at input 78 of a phase detector 80. Applied to the other input 82 of phase detector 80 is the input frequency signal, $f_{input}$, the selection and generation of which with respect to a desired output frequency will be more fully explained in following paragraphs. Phase detector 80 compares the phase of the signals at its inputs 78 and 82, and generates an output control signal, the magnitude of which is proportional to the phase difference between the signals at inputs 78 and 82. The output of phase detector 80 is amplified by amplifier 84, the output of which is applied at one input 86 of search and lock circuit 88. Search and lock circuit 88 is initially responsive to control signals at input 89 from logic control circuit 90 through D/A converter 92 to presteer or initially set the frequency of the VCO 94 to the vicinity of the frequency at which it will be operating for a selected output frequency. After presteering, the output of the phase detector 80 is applied at input 96 of the VCO 94. In conventional fashion, the frequency of the output of VCO 94 will be proportional to the magnitude of the control signal from phase detector 80.

The output of the VCO 94 is applied at input 98 of pin diode 100, which acts to attenuate the amplitude of the output signal from the VCO 94. The output of the pin diode 100 is applied through isolator circuit 102 to input 103 of signal splitter 104, which has three outputs. Signal splitter 104 splits the signal present at its input 103 into three output signals identical in waveform but having different power levels. The signal at output 106 has the greatest power, and is the output signal $f_{out}$ of the synthesizer circuit, appearing at circuit output 108. The signal at output 110 is applied through an isolator circuit 112 to input 70 of mixer 68.

The VCO 94, pin diode 100, signal splitter 104, mixer 68, low-pass filter 76, phase detector 80, amplifier 84, and search and lock circuit 88, with isolators 74, 102 and 112, form a phase-locked loop. In conventional fashion, the output frequency of VCO 94 will vary under the control of phase detector 80 until the input frequency $f_{input}$ at phase detector input 82 is equal to the difference between $f_{out}$ from the VCO 94 and the stepping frequency $f_{step}$ from selection circuit 58. At that point, the loop is locked, and the frequency of $f_{out}$ will remain steady.

The phase-locked loop includes a level control circuit 119. The desired power level of the output signal at 108 may be established by the operator through front panel control circuit 126. The signal at the third output 114 of signal splitter 104 is applied to a power detector 116, which looks at the power level of an applied signal. Since the signal splitter 104 distributes the power of the signal present at its input 103 into predetermined fractions at its respective outputs, the power level of the signal at output 114 will vary proportionately with a variance in the power level of the signal at input 103. The output of power detector 116 is a DC signal having a magnitude which is proportional to the level of power of the signal applied at its input from signal splitter 104. As the power from signal splitter 104 varies, the magnitude of the output of detector 116 will vary accordingly. This varying signal is applied at input 118 of amplifier 120, which is also responsive to control signals from the front panel controls 126 at input 122. Amplifier 120 compares the signals present at its inputs 118 and 122 and generates an output control signal which is applied at input 124 of pin diode 100. For a given control signal level present at input 122, the magnitude of the output of amplifier 120 will change in proportion to a change in the magnitude of the signal present at input 124. The attenuation level of the pin diode changes correspondingly, thereby altering the level of the output from VCO 94. The level control circuit 119 thus tends to maintain the power level of the conversion circuit at a constant preselected level.

The desired frequency which is to be generated by the conversion circuit is selected by an operator by means of front panel control circuit 126, which includes a series of rotary switches (not shown), one for each digit in the selected output frequency. The number of rotary switches may vary, of course, with the intended application of the synthesizer circuit, but for purposes of explanation, seven rotary switches, corresponding to seven frequency digits, are used in the synthesizer embodiment of the present invention.

As explained above, continuous constant increment frequency coverage of an output frequency range of 2.1–2.8 GHz may be achieved with a reference frequency of 160 MHz and an input frequency range of 80–160 MHz. Other output frequency ranges may, of course, be accomplished with corresponding reference and input frequency ranges.

The setting established by an operator on the rotary switches or similar selection circuitry is converted conventionally into corresponding binary coded digit format, and the BCD signals are then applied to logic control circuit 90. The logic control circuit 90 compares the BCD signals from circuit 126 with each location in its pre-established read-only memory look-up table. Each output frequency capable of being selected will have associated therewith in read-only memory a signal representative of a particular stepping frequency, a signal representative of a portion of a particular input frequency, and a signal indicating whether the selected output frequency is in the output range portion above or below the stepping frequency. This information for each possible output frequency is precalculated, and established within the memory of the logic control circuit 90, such that the three signals noted above associated in memory with the desired output frequency are available to the control circuit 90 when a correct comparison is made between the desired output frequency selected by the operator, and its corresponding location in memory.

When a correct comparison is made, the logic circuit 90 generates three output signals. One output signal is applied to an 80–160 MHz frequency synthesizer 128 for control thereof to generate the proper input signal to be applied to input 82 of phase detector 80, while the other two output signals are applied to the D/A converter 92. One of the output signals to D/A converter 92 from control circuit 90 appears on output lines **128*a*, 128*b*,** 128*c* and **128*d* and is representative of the correct stepping frequency for the generation of the selected output frequency. The D/A converter 92 detects the digital signal present on lines 128*a* through 128*d*, and generates a corresponding analog signal which is applied both to current driver circuit 130 for control of selection circuit 58, and to search and lock circuit 88 for presteering of VCO 94. The current driver circuit 130 controls the operation of the selective filter 62, which for purposes of explanation is a YIG filter. A YIG filter is a current-dependent device, with the value of its center or pass frequency depending upon the magnitude of current applied to its control input. The correct stepping frequency for a selected output frequency may be obtained by applying a current of appropriate magnitude to the control input of the YIG filter. The signal from logic control circuit 90, and hence the corresponding analog signal from the D/A converter 92 are, as noted above, preprogrammed such that the selection of a particular output frequency results in a signal from D/A converter 92** having a magnitude which results in the YIG filter centering about the correct stepping frequency. In accordance with the principles of the present invention, a single stepping frequency $f_{step}$ is utilized to generate two portions of the output frequency range, and the memory is so programmed.

A third output signal from the control circuit 90 appears on line 132, and is representative of whether the selected output frequency is in the output frequency portion above or below the correct stepping frequency for that output frequency. This signal is also precalculated and stored in memory for each selected output frequency. The signal is applied to D/A converter 92, which in turn applies a corresponding analog signal in the form of an offset signal to search and lock circuit 88.

Figures 8, 9:
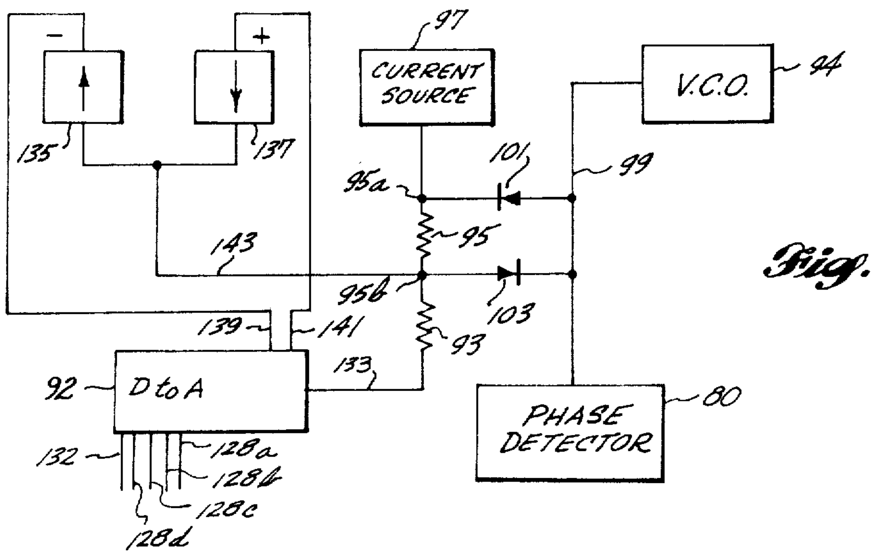
FIG. 8 is a chart showing an output frequency range broken down into a series of output frequency portions, and the associated stepping frequency and the direction of frequency change in the input frequency for coverage of each output frequency portion.
FIG. 9 is a simplified block diagram of the presteering portion of the circuit shown in FIG. 6.

A simplified representation of search and lock circuit 88 is shown in FIG. 9. The analog signals corresponding to the digital signals on lines 128a through 128d operate in combination with the offset signal on line 132 to presteer the VCO 94 to near its correct operating frequency. Presteering of the VCO 94 is necessary because phase detector 88 does not have a large enough capture bandwidth to initially force the VCO 94 into the correct frequency region. Thus, without presteering the phase-locked loop may never stabilize. Referring to FIG. 9, the analog signal from D/A 92 is applied through resistances 93 and 95 in opposition to a known current from current source 97. Connected between one end **95*a* of resistance 95 and a direct line connection 99 between phase detector 80 and VCO 94 is a first diode 101, the cathode thereof being common to end 95*a*. Connected to the other end 95*b* of resistance 95 is the anode of diode 103, the cathode of which is connected to the direct connection 99, in common with the anode of diode 101. The respective voltage levels at ends 95*a* and 95*b* of resistance 95 are fixed by the level of current source 97, the signal from the D/A converter on lines 128*a* through 128*d*, and the offset current on the line 132. This establishes a frequency "window" for the VCO 94. The signal on connection 99 from phase detector 80 can never be lower than one diode drop relative to the signal at end 95*b* and can never be higher than one diode drop relative to the signal at end 95*a*. The search and lock circuit 88 thus sets fixed boundaries on the magnitude of the signal to the VCO 94 and thus forces the VCO to operate initially within a given range of frequencies over which the phase detector 80** can then properly drive the VCO to a specific frequency.

The offset signal on line 132 from D/A converter 92 affects the operation of the search and lock circuit 88 by introducing an additive or subtractive factor to the signal levels established by current source 97 and the signal on line 133 from the signals on lines 128*a* through 128*d*. The offset circuitry is shown diagrammatically as positive and negative current sources 135 and 137, respectively, which are responsive to the signals on lines 139 and 141 from D/A 92 to generate a corresponding offset signal (either positive or negative) on line 143. If the signal on line 143 is positive, the frequency window will be shifted upward in frequency, because the signal levels at the respective ends 95*a*, 95*b* of resistance 95 will be shifted correspondingly upward, while if the signal on line 143 is negative, the frequency window will be shifted downward in frequency. This offset feature assists the presteering of the VCO to the correct output frequency range portion for a selected output frequency.

As explained above, each stepping frequency is utilized with two independent portions of an output frequency range. The relationship between stepping frequencies, input frequencies, and resulting output frequencies is clarified in FIG. 8 for the frequency coverage of 2.1 GHz–2.8 GHz of the preferred frequency synthesizer embodiment. The output frequency range is divided into nine successive portions, each portion having an associated stepping frequency, with a single stepping frequency covering two independent portions in several instances, in accordance with the principles of the present invention. As one example, a stepping frequency of 2.40 GHz is utilized with an output frequency portion of 2.240 GHz through 2.32 GHz, which portion is below the stepping frequency, and another portion of 2.98 GHz through 2.56 GHz, which portion is above the stepping frequency. To provide continuous constant increment frequency coverage over each portion, an input frequency range of 0.080 through 0.160 GHz is utilized. The generation of a particular output frequency requires the selection and generation of a particular corresponding input frequency, which input frequency is then applied to input 82 of phase detector 80. The input frequencies are tuned from 80–160 MHz, when the stepping frequency is lower than the selected output frequency, and are tuned from high (160 MHz) to low (80 MHz) when the stepping frequency is greater than the output frequency range portion in which the desired output frequency is located. The selection of a proper input frequency for a particular output frequency is accomplished by the logic control circuit 90.

Figure 7:
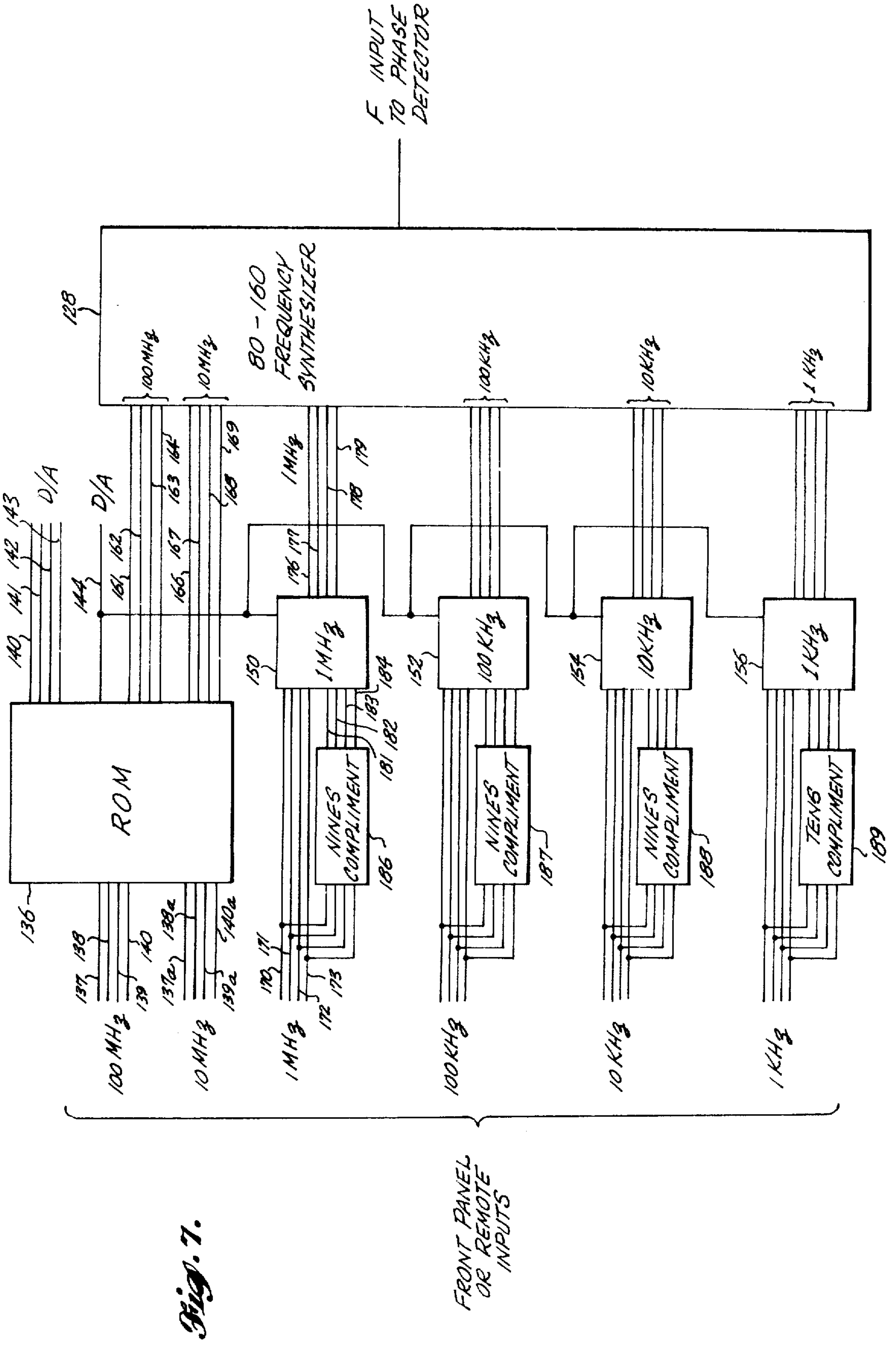
FIG. 7 is a block diagram of the logic control portion of the circuit shown as a single block in FIG. 6.

Referring to FIG. 7, a block diagram of the logic circuitry for providing the proper commands to the 80–160 MHz frequency synthesizer 128 for generation of the input frequencies is shown. The BCD input signals to the logic control circuit 90 may be originated by the front panel control circuit 126, or from a remote input circuit. Each input includes a series of signal lines for the digits of 1 KHz, 10 KHz, 100 KHz, 1 MHz, 10 MHz, and 100 MHz, respectively, and the BCD signals representing the operator selected value of each digit is impressed upon those lines. A connection for the unit GHz place in the output frequency is not included in FIG. 7 since it is always two. (The output range for the preferred frequency synthesizer embodiment is 2.1–2.8 GHz).

In operation, the BCD signals for the 100 MHz and 10 MHz digit places in the selected output frequency are applied to the read-only memory 136. Assuming front panel inputs, the BCD signals representing the 100 MHz and the 10 MHz places, appearing on signal lines 137, 138, 139, 140 and 137*a*, 138*a*, 139*a*, and 140*a* sufficiently identify the selected output frequency for the purpose of identifying the particular output frequency portion in which it is located. In conventional fashion, the signals on signal lines 137 through 140 and 137*a* through 140*a* are compared with a precalculated lookup table in read-only memory 136 to ascertain which output frequency portion the selected output frequency is in. When the proper memory position has been located, the memory 136 will read out on signal lines 140, 141, 142, 143 a digital number corresponding to the correct stepping frequency, and on line 144 a one or zero, depending on whether the selected output frequency is in a portion above or below the stepping frequency. Lines 140 through 144 are connected to the D/A converter 92, through lines 128*a* through 128*d* as explained above. The signal on line 144 besides being applied to D/A 92 through line 132 is also applied as a control signal to select gates 150, 152, 154 and 156. The read-only memory 136 also generates signals over output lines 161, 162, 163 and 164 representative of the correct 100 MHz digit in the input frequency and generates signals over output lines 166, 167, 168, and 169 for the 10 MHz digit. Thus, for a selected output frequency, the correct signals to the input frequency synthesizer 128 for the 100 MHz and 10 MHz places are generated directly from the read-only memory 136. The signal inputs to the 80–160 MHz input frequency synthesizer 128 for the remaining digits (1 KHz, 10 KHz, 100 Khz, and 1 MHz) are generated by select gates 150, 152, 154 and 156.

Two sets of inputs are applied to each select gate, a first set of inputs coming directly from the front panel or remote inputs and the second set from the front panel or remote inputs through a complimenting circuit. Each select gate has a series of output lines, which are connected to the input frequency synthesizer 128 for control of the generation of one digit in the input frequency. The signals on the output lines from each select gate and from the ROM 136 to the synthesizer 128 thus control the generation of an input frequency $f_{input}$, which is applied to input 82 of phase detector 80, as explained above.

The signals present at the output lines of each select gate will either be the first or second set of inputs, to each select gate depending on the condition of the signal on line 144. When the signal on line 144 is high, indicating that the selected output frequency is above the stepping frequency, the first set of inputs to each select gate is applied on the select gate output lines to the synthesizer 128. If the signal on line 144 is low, indicating that the selected output frequency is below the stepping frequency, each select gate is controlled to apply its second set of inputs to its output lines. For example, if the input to select gate 150 is high, the front panel inputs on lines 170, 171, 172, and 173, forming the first set of inputs to select gate 152, are connected by the select gate 152 to output lines 176, 177, 178 and 179, respectively, which in turn are connected to the synthesizer 128 as the control signals for the 1 MHz digit for the correct input frequency. If the signal on line 144, is low, the signals on lines 181, 182, 183, and 184, which are the nines complement of the signals on lines 170 through 173 and which form the second set of inputs to select gate 152, are connected by the select gate 152 to the output lines 176, 177, 178, and 179, respectively, for application to synthesizer 128.

Such a logic implementation is made possible because the least significant digit of the stepping frequency is the 10 MHz digit. Since the least significant digit of the stepping frequency is the 10 MHz digit, the values for the 1 KHz, 10 KHz, 100 KHz and 1 MHz digit places of the correct input frequency, with respect to a selected output frequency, correspond exactly to the value of the corresponding digit places of the selected output frequency, if the output frequency portion containing the selected output frequency is above the stepping frequency. Thus, the values for the 1 KHz, 10 KHz, 100 KHz and 1 MHz digits of the selected output frequency may be routed directly as control signals to the 80–160 frequency synthesizer 128. For instance, if the selected output frequency is 2.366866 GHz, which has a stepping frequency of 2.24 GHz, (FIG. 9) the necessary input frequency to lock the loop from the 80–160 MHz synthesizer must be $f_{out} - f_{step}$, or 0.126866 MHz. The 1 KHz, 10 KHz, 100 KHz and 1 MHz values correspond in each instance identically with the values in those digit places of the selected output frequency.

Similarly, the correct values for the 1 KHz, 10 KHz, 100 KHz and 1 MHz digit places of an input frequency where the desired output frequency is in a portion below the stepping frequency, is achieved by subtraction of the selected output frequency values from the stepping frequency. Since all places in the stepping frequency are zero below the 10 MHz place the correct input frequency values for those digit places may be achieved by subtracting the value for the 1 KHz place from 10 and the remaining places of 10 KHz to 1 MHz from 9. This is achieved by conventional ten and nines logic complimenting techniques. For example, if the desired output frequency is 2.428742 GHz, the correct stepping frequency, according to FIG. 8, is 2.56 GHz. The correct input frequency then must be the difference frequency between $f_{out}$ and $f_{step}$, or 0.131258 GHz, which includes the subtractive function noted above for the 1 KHz, 10 KHz, 100 KHz and 1 MHz digits of the input frequency. These subtractive inputs, the second set of inputs to each select gate, are generated by the complimenting circuits 186, 187, 188, and 189, respectively, for the digit places of 1 KHz through 1 MHz. Complimenting circuits 186, 187, and 188 are nines complimenting circuits, and complimenting circuit 189 is a tens complimenting circuit. As stated above, the correct commands to the 80–160 MHz synthesizer 128 for both the 100 MHz and 10 MHz place are precalculated for both the condition when the stepping frequency is above the desired output frequency, and the condition when the stepping frequency is below the desired output frequency. The commands for the 100 MHz and 10 MHz places are applied directly from the ROM 136 to the synthesizer 128.

Figure 4:
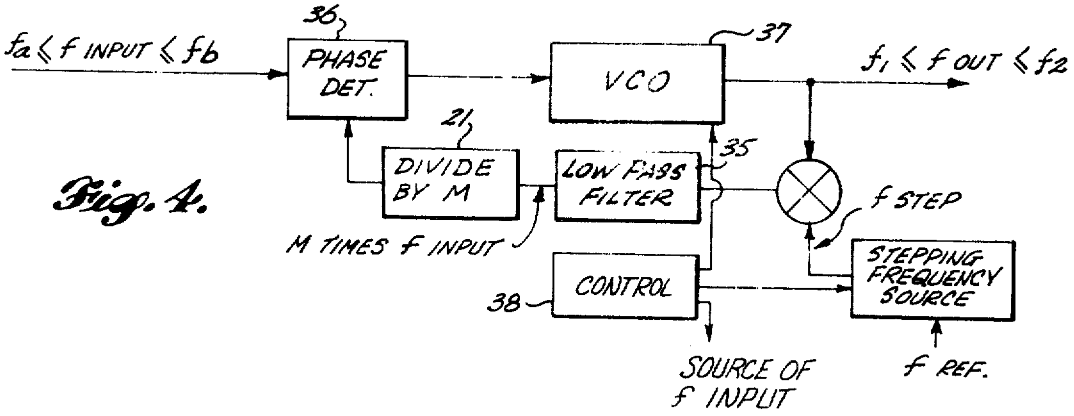
FIG. 4 is a simplified block diagram of a frequency conversion circuit showing a first modification of the circuit of the preferred embodiment.
Figure 5:
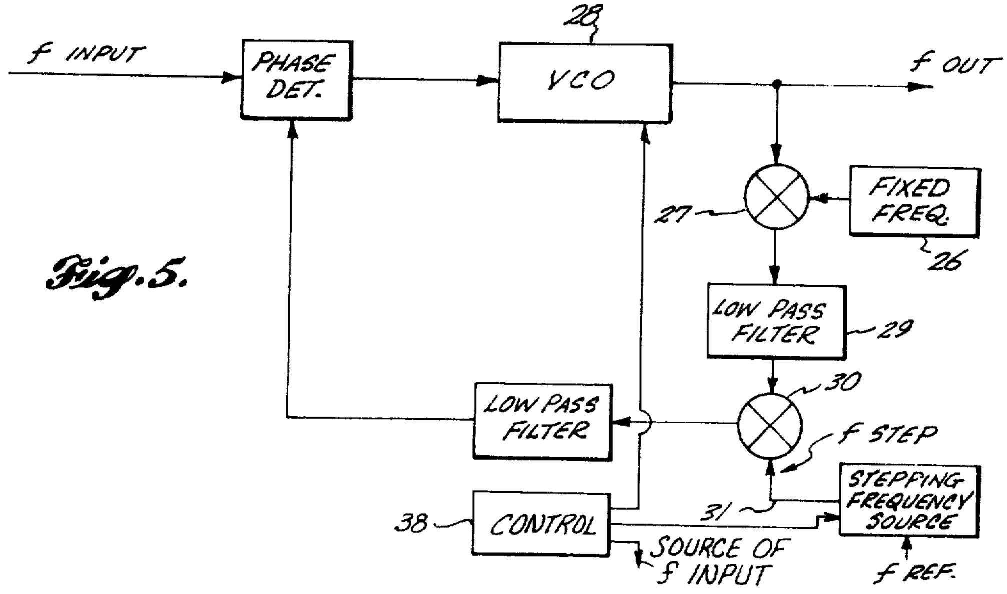
FIG. 5 is a simplified block diagram showing a second modification of the circuit of the preferred embodiment.

Several modifications may be made to the synthesizer of FIG. 6 to extend its range or to make it more operationally flexible. Two possible modifications are shown in FIGS. 4 and 5, with the control circuits (88, 90, 92, and 126 in FIG. 6) being shown as control block 38. In FIG. 4, the invention includes a standard divider 21 having a division factor M connected between the low-pass filter 35 and the phase detector 36. This allows the VCO 37 to cover output frequencies from $f_{step} - Mf_b$ to $f_{step} - Mf_a$ and from $f_{step} + Mf_a$ to $f_{step} + Mf_b$. This will even further reduce the number of individual stepping frequencies required and allow $f_{ref}$ to become $Mf_{ref}$ for a given range of output frequencies. For instance, if the division factor $M$ was set at two, the frequency of the signal from the low-pass filter will be $2f_{input}$ for a loop lock condition. For an $f_{ref}$ of $2f_a$, and an input frequency range of $f_a \leq f_{input} \geq 2f_a$, only alternate steps of 1, 3, 5, . . . are necessary to again result in full output frequency coverage. Other division factors will result in further savings.

FIG. 5 shows another modification of the synthesizer of FIG. 6. Added to the phase-locked loop is a fixed frequency source 26, a mixer 27 having inputs from the fixed frequency source 26 and the output of the VCO 28, and a low-pass filter 29. The output of the mixer 27 is applied to the low-pass filter 29, the output of which is applied to the mixer 30. This modification permits a significantly higher range of output frequencies with the same stepping frequency components of FIG. 6. The output frequency from the VCO 28 is converted to a lower frequency by the mixer 27. This decrease in the frequency of the signal applied to mixer 30 results in lower stepping frequencies to achieve a given output frequency and circuit savings thereby. By converting the VCO output frequency to a lower frequency by mixer 27 a high VCO output frequency may be made to look low, for purposes of mixing with $f_{step}$ and locking the loop.

Although a preferred embodiment of the invention has been disclosed herein for purposes of illustration, it will be understood that further changes, modifications, and substitutions in addition to those discussed above, may be incorporated in such embodiments without departing from the spirit of the invention as defined by the claims which follow.

What is claimed is:

1. A variable frequency signal generator, comprising:

closed loop circuit means operable to produce a circuit output signal of controllable frequency over an output frequency range, said closed loop circuit means including a signal generator means producing an output signal which is said circuit output signal, said signal generator including a control input for control of the frequency of said circuit output signal, said closed loop circuit means further including a first signal mixing means having first and second input;

first signal source means operable to produce a stepping signal of selectively variable frequency over a first frequency range;

means applying said circuit output signal to said first input of said first signal mixing means;

means applying said stepping signal to said second input of said first signal mixing means, said first signal mixing means operable in response to said circuit output signal and said stepping signal to produce an output signal having sum and difference frequencies;

second signal source means operable to produce an input signal of selectively variable frequency over a second frequency range;

detector means in said closed loop circuit means responsive to said difference signal from said first signal mixing means and said input signal from said second signal source means for generating a control signal when said circuit output signal applied to said first signal mixing means is higher in frequency than said stepping signal applied to said first signal mixing means, and also when said circuit output signal applied to said first signal mixing means is lower in frequency than said stepping signal applied to said first signal mixing means, said closed loop circuit being stabilized when the frequency of said input signal is equal to said difference frequency;

means applying said control signal to said control input of said signal generator means to adjust the output frequency of said circuit output signal, until said closed loop circuit means is stabilized, said closed loop circuit means capable of stabilizing at first and second output frequencies, respectively, with one input signal frequency and one stepping signal frequency, said first and second output frequencies being above and below, respectively, the frequency of said one stepping signal frequency by the amount of the frequency of said one input signal frequency;

means for selecting a desired output frequency from said output frequency range;

control means responsive to said selecting means for controlling the frequencies of said first and second signal source means, respectively, and for partially controlling the frequency of said circuit output signal such that said closed loop circuit means tends to stabilize at a selected one of said first and second output frequencies.

2. An apparatus of claim 1, wherein said control means includes logic means responsive to said selecting means for selecting one stepping signal frequency and one input signal frequency for each output frequency.

3. An apparatus of claim 1, wherein said first frequency range includes a high and a low input frequency defining a first frequency separation therebetween, and wherein a second frequency separation exists between successive frequencies in said second frequency range, said second frequency separation being no greater than said first frequency separation.

4. An apparatus of claim 1, wherein said first signal source means includes means for generating a reference frequency, and means for generating a series of harmonic frequencies of said reference frequency, and further includes selective filter means responsive to said control means for discriminating selectively between said harmonic frequencies in accordance with said desired output frequency.

5. An apparatus of claim 1, wherein each single stepping frequency is associated with first and second independent portions of said output frequency range, said first independent portion including those circuit output signals having frequencies defined by adding each input frequency in turn to said single stepping frequency, and said second portion including those circuit output signals having frequencies formed by subtracting each input frequency in turn from said single stepping frequency.

6. An apparatus of claim 1, wherein said closed loop circuit means further includes a circuit output signal level control means, said level control means comprising means for detecting the power level of a given circuit output signal, means coupling a portion of said given circuit output signal to said power detecting means, means for attenuating the power level of said given circuit output signal, means responsive to said power detecting means for comparing the detected power level of said given circuit output signal with a desired power level, and means controlling said attenuating means so as to maintain the power level of said given circuit output signal at said desired power level.

7. An apparatus of claim 1, wherein each output frequency has associated therewith a preselected stepping frequency, said control means including means producing first and second control output signals, and means applying said first and second control output signals to said signal generator means, said producing means producing said first control output signal when a selected circuit output signal is higher in frequency than its associated stepping signal and producing said second control output signal when said selected circuit output signal is lower in frequency than its associated stepping signal.

8. An apparatus of claim 2, wherein said control means includes memory means for storing information representative of the one stepping frequency associated with each output frequency.

9. An apparatus of claim 1, including frequency divider means connected between said first signal mixing means and said detector means.

10. An apparatus of claim 1, including a second signal mixing means having two inputs and an output and a third signal source means and including means connecting said third signal source means to one input of said second signal mixing means, means applying said circuit output signals to said other input of said second signal mixing means, and means connecting the output of said second signal mixing means to said one input of said first signal mixing means.

11. A frequency synthesizer, comprising:

a phase locked loop comprising in series connection a voltage controlled oscillator, a first signal mixing means having first and second inputs, and a phase detector having first and second inputs, wherein said voltage controlled oscillator is operable under control of said phase detector to produce circuit output signal having an output frequency controllable over an output frequency range;

first signal source means operable to produce a stepping signal having a stepping frequency;

means applying said stepping signal to said first input of said first signal mixing means, said first signal mixing means being responsive to said stepping signal at the first input thereof and to said circuit output signal at the second input thereof to generate an output signal having sum and difference frequencies;

second signal source means operable to produce an input signal having an input frequency;

means for selecting a desired output frequency, each output frequency having associated therewith one input signal frequency and one stepping signal frequency;

means applying said input signal to said first input of said phase detector, said phase detector being responsive to an input signal at its first input and to a difference frequency from said first signal mixing means at its second input to generate a control signal having a level proportional to any phase difference between said input signal and said difference frequency, said phase detector being equally responsive to a first difference frequency produced when a stepping signal applied to said first signal mixing means is higher in frequency by a given amount than a circuit output signal applied to said first signal mixing means, and to an identical difference frequency produced when a stepping signal applied to said first signal mixing means is lower in frequency by said given amount than a circuit output signal applied to said first signal mixing means, said voltage controlled oscillator producing first and second output frequencies with one input signal frequency and one stepping signal frequency;

control means responsive to said selecting means for controlling said voltage controlled oscillator in conjunction with said phase detector such that the selected one of said first and second output frequencies is produced; and an output frequency level control means connected in said phase locked loop, said level control means comprising means for detecting the power level of a given circuit output signal, means coupling a portion of said given circuit output signal to said power detecting means, means for attenuating the power level of said given circuit output signal, and means responsive to said power detecting means for comparing the detected power level of said given circuit output signal with a desired power level and controlling said attenuating means so as to maintain the power level of said given circuit output signal at said desired power level.

12. An apparatus of claim 11, wherein said control means includes means for producing a first control output signal when a selected output frequency is higher in frequency than its associated stepping frequency and for producing a second control output signal when a selected output frequency is lower in frequency than its associated stepping signal frequency.

13. An apparatus of claim 11, wherein said first signal source means is operable to produce a plurality of stepping signal frequencies, wherein said second signal source means is operable to produce a plurality of input signal frequencies, wherein each output frequency has associated therewith a preselected stepping frequency, and including means for generating an input control signal representative of any difference in frequency between a selected output frequency and its associated preselected stepping frequency, and means for applying said input control signal to said second signal source means, said second signal source means producing in response thereto an input signal having a frequency equal to the difference between said selected output frequency and its associated preselected stepping frequency.

14. An apparatus of claim 11, including a second signal mixing means having two inputs and an output, and a third signal source means including means connecting said third signal source means to one input of said second signal mixing means, means applying said circuit output signals to said other input of said second signal mixing means, and means connecting the output of said second signal mixing means to said one input of said first signal mixing means.

* * * * *